United States Patent
Watkins et al.

(10) Patent No.: US 9,720,028 B1
(45) Date of Patent: Aug. 1, 2017

(54) ADAPTIVE LIVE CIRCUIT CHARACTERIZATION

(71) Applicant: LiveWire Innovation, Inc., South Jordan, UT (US)

(72) Inventors: Lee Arthur Watkins, Thousand Oaks, CA (US); Niall Michael McNamara, Santa Barbara, CA (US)

(73) Assignee: LiveWire Innovation, Inc., South Jordan, UT (US)

(*) Notice: Subject to any disclaimer, the term of this patent is extended or adjusted under 35 U.S.C. 154(b) by 0 days.

(21) Appl. No.: 15/278,987

(22) Filed: Sep. 28, 2016

(51) Int. Cl.
  *G01R 31/11* (2006.01)
  *G01R 31/08* (2006.01)
  *G01R 31/02* (2006.01)

(52) U.S. Cl.
  CPC ............ *G01R 31/11* (2013.01); *G01R 31/021* (2013.01); *G01R 31/025* (2013.01); *G01R 31/083* (2013.01); *G01R 31/085* (2013.01)

(58) Field of Classification Search
  CPC ...... G01R 31/11; G01R 31/021; G01R 31/08; G01R 31/086; G01R 31/083; G01R 31/085

USPC .......................................... 324/533, 534, 535
See application file for complete search history.

(56) References Cited

U.S. PATENT DOCUMENTS

| 9,244,117 B2 * | 1/2016 | Furse | ................. G01R 31/2841 |
| 2006/0012376 A1 * | 1/2006 | Furse | ..................... G01R 31/11 |
| | | | 324/534 |

* cited by examiner

*Primary Examiner* — Amy He
(74) *Attorney, Agent, or Firm* — SoCal IP Law Group LLP; John E. Gunther; Steven C. Sereboff (57) ABSTRACT

There are disclosed apparatus and methods for testing a live circuit powered from an alternating current (AC) voltage. A live circuit tester includes a spread spectrum time domain reflectometer (SSTDR) configured to perform SSTDR measurements of the live circuit and a memory storing one or more ignore distance values. A processor coupled to the SSTDR and the memory detects a potential fault in the live circuit based on results of one or more SSTDR measurements, the potential fault associated with a distance from the apparatus. The processor compares the distance associated with the potential fault with each of the one or more ignore distance values, and stores, in the memory, data defining the potential fault if the associated distance does not match any of the one or more ignore distance values.

15 Claims, 4 Drawing Sheets

ADAPTIVE LIVE CIRCUIT CHARACTERIZATION

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to electrical system testing and particularly to testing electrical power distributions systems for intermittent faults.

Description of the Related Art

Electronic systems are ubiquitous. An essential component of these systems is their internal signal paths, most typically provided by wired interconnects. Failures in the wiring frequently result in failure of the system. For example, aging wiring in buildings, aircraft and transportation systems, consumer products, industrial machinery, and the like is among the most significant potential causes of catastrophic failure and maintenance cost in these structures. High profile airline crashes attributed to aging wiring have brought the need for improved wire testing systems to the forefront of industry attention.

Various techniques for the characterization and fault detection of electronic signal paths are known. For example, techniques such as time domain reflectometry (TDR), frequency domain reflectometry (FDR), and sequence time domain reflectometry (STDR) can be used to determine where a short or break in a wire has occurred. More recently, improvements such as spectral time domain reflectometry (STRDR) and spread spectrum time domain reflectometry (SSTDR) have been developed to allow testing of a wire while operational signals are present. Common to all of these techniques is the injection of a reflectometry test signal into the wire to be tested, and observation of the response. As the test signal propagates from the test instrument, impedance mismatches in the wire generate reflections that propagate back to the test instrument. Impedance mismatches can be caused by a variety of things, including for example, breaks in the wire, short circuits, branches, and wire gauge changes. The resulting response can be analyzed to determine features of the wire, such as distance to an open or short circuit.

Traditionally, reflectometry has been a form of off-line testing, since on-line live testing was avoided because the test signal may interfere with the existing power and/or signals on the line, and vice versa. Unfortunately, certain types of failures, such as an intermittent open-circuit or short-circuit, are difficult to detect off-line, since the conditions causing the failure are often not present during off-line testing.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

Description of Apparatus

Figure 1:
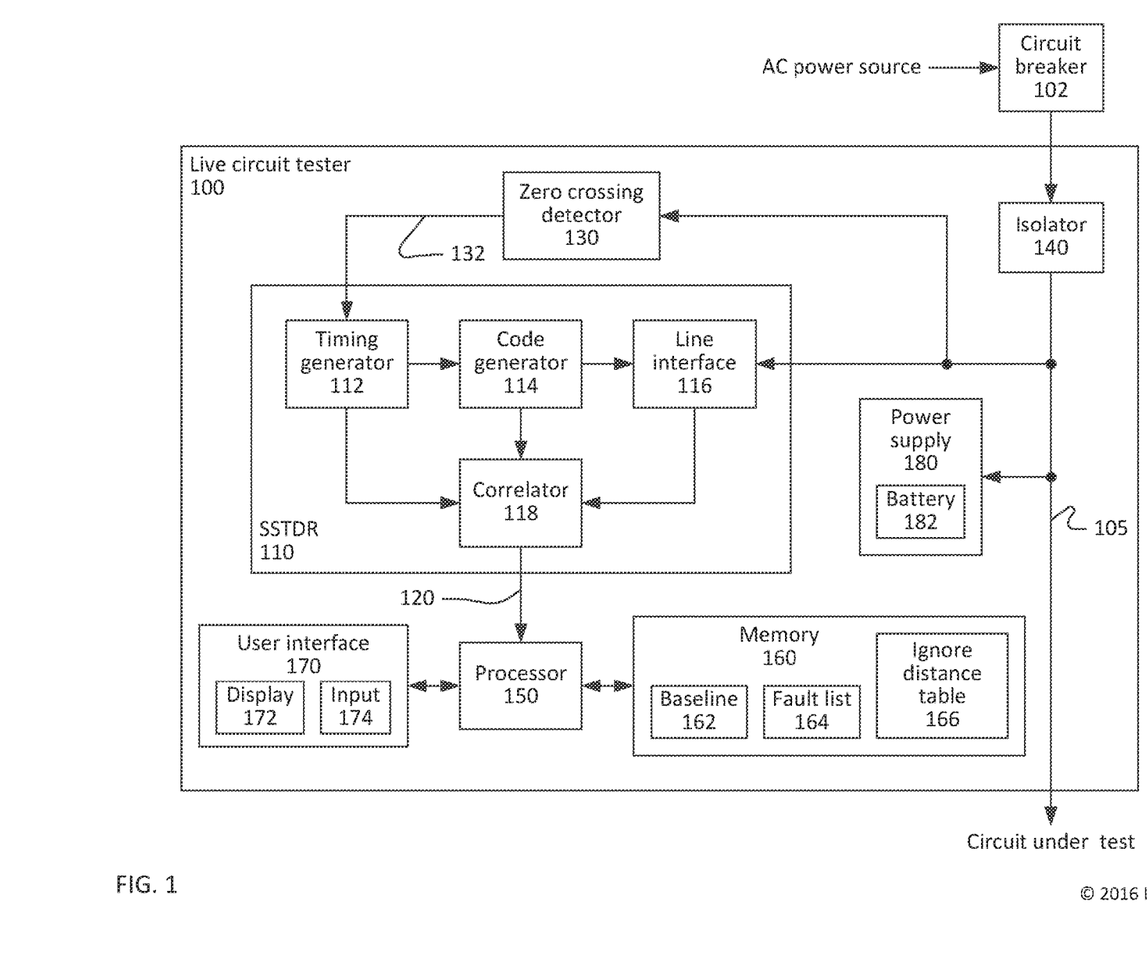
FIG. 1 is a block diagram of a live circuit tester.

Referring now to FIG. 1, a live circuit tester 100 may be inserted between an AC power source and a circuit under test to test the circuit for intermittent and permanent shorts, opens, and other faults. For example, the live circuit tester 100 may be inserted in a breaker box and connected between the circuit under test and the corresponding circuit breaker 102.

The live circuit tester 100 includes a spread spectrum time domain reflectometer (SSTDR) 110, a zero crossing detector 130, an isolator 140, a processor 150, a memory 160, a user interface 170, and a power supply 180. The elements 110-180 of the live circuit tester 100 may be contained within a single physical unit, or may be distributed between multiple units. For example, the isolator 140, which may be configured to transmit high currents from the AC power source to loads within the circuit under test, may be contained in a separate physical unit from other elements of the live circuit tester.

The SSTDR 110 includes a timing generator 112, a code generator 114, a line interface 116, and a correlator 118. The timing generator 112 synchronizes the operation of the other elements of the SSTDR 110. The code generator 114 generates a pseudorandom noise (pn) code. A pn code has the characteristics of a random sequence of bits but is deterministically generated using specialized circuits and/or algorithms. The pn code from the code generator 114 is coupled onto the AC power line 105 via the line interface 116. The line interface 116 may include a directional coupler, a circulator, or some other circuit elements to couple the pn code onto the AC power line 105 and to extract reflections of the pn code from the AC power line 105.

The pn code coupled onto the AC power line 105 propagates into the circuit under test, but is prevented from propagating toward the AC power source by the isolator 140. The isolator 140 may be an inductor or low pass filter that blocks propagation of the pn code towards the AC power source while transmitting AC power from the AC power source to the circuit under test.

Each impedance discontinuity in the circuit under test will cause a portion of the energy of the pn code to reflect back to the SSTDR. The reflected energy is separated from the AC power line 105 by the line interface 116. The separated reflected energy is input to the correlator 118. The correlator 118 may be an analog or digital circuit that correlates the reflected energy with a plurality of successively delayed copies of the pn code generated by the code generator 114. The correlator 118 outputs correlation data 120 to the processor 150. The correlation data includes multiple data values representing the correlation of the reflected energy and the pn code delayed by respective delay times. Each delay time represents a round-trip transit time from the SSTDR to a location within the circuit under test. Each delay time can be converted into a distance from the SSTDR to the corresponding location within the circuit under test using a known or presumed propagation velocity of the pn code over the circuit under test. Thus each correlation data value represents an estimate of the degree of impedance discontinuity (or lack thereof) at a point within the circuit under test located at a respective distance from the live circuit tester 100. The distance from the live circuit tester 100 to an impedance discontinuity can be determined by interpolating between adjacent correlation data values.

The processor 150 includes hardware, which may be augmented by software and/or firmware, for providing functionality and features described herein. The processor 150 may therefore include one or more of: logic arrays, memories, analog circuits, digital circuits, software, firmware, and processors such as microprocessors, field programmable gate arrays (FPGAs), application specific integrated circuits (ASICs), programmable logic devices (PLDs) and programmable logic arrays (PLAs). The hardware and firmware components of the processor 150 may include various specialized units, circuits, software and interfaces for providing the functionality and features described here. The processes, functionality and features may be embodied in whole or in part in software executed by the hardware of the processor 150. This software may be in the form of firmware, an application program, an applet (e.g., a Java applet), a browser plug-in, a COM object, a dynamic linked library (DLL), a script, one or more subroutines, or an operating system component or service. The hardware and software and their functions may be distributed such that some components are performed by the processor 150 and others by other devices.

The memory 160 may include read only memory (ROM), random access memory (RAM), flash memory or other nonvolatile memory, or a combination thereof. The memory 160 may store program instructions for execution by the processor. The memory 160 may also store data such as correlation data and intermediate and final results of processes performed upon the correlation data.

The processor 150, in combination with the memory 160, may process the correlation data 120 from the SSTDR 110 to detect potential faults within the circuit under test. A fault, such as a short or an open circuit, will cause an impedance discontinuity resulting in a reflection of pn code energy back towards the SSTDR. The reflected pn code energy will result in an elevated value of one or more of the correlation data values 120. However, every substantial load within the circuit under test is also an impedance discontinuity that reflects pn code energy back towards the SSTDR. Thus not all elevated correlation data values are caused by actual faults.

To identify potential faults, the processor may establish and store a correlation data baseline 162. The correlation data baseline 162 may be a set of baseline correlation values representing the expected correlation data values resulting from reflections from the circuit under test when the circuit under test is operating normally. The correlation data baseline 162 may be established, for example, as an average of multiple sets of correlation data values. Potential faults may then be identified by comparing correlation data values 120 received from the correlator 118 with the baseline 162 stored in the memory 160. A significant difference between one or more of the real-time correlation values and the corresponding baseline values may indicate a potential fault at the corresponding distance from the live circuit tester 100.

Certain types of faults in the circuit under test may be intermittent and dynamic. For example, an intermittent short or open may arc only during a portion of each half-cycle of the AC line voltage. Such dynamic faults may cause a significant change in impedance during some or all half cycles of the AC line voltage. Such an impedance change occurring while the correlator 118 is correlating reflected energy from the line interface 116 with delayed copies of the pn code from the code generator 114 can result in errors in the correlation data 120. Such errors may cause the processor 150 to misinterpret the correlation data such that a potential fault is not identified, or an identified potential fault is estimated to be in an incorrect location.

To provide consistent correlation data in the presence of intermittent faults, the live circuit tester 100 may synchronize the activity of the correlator 118 with zero-crossings of the AC line voltage. To this end, the live circuit tester 100 includes a zero crossing detector 130 that provides a zero crossing signal 132 to the timing generator at each zero crossing of the AC line voltage. The timing generator uses the zero crossing signal 132 to synchronize the operation of the correlator 118 such that correlations are performed only during a correlation time window proximate to the zero crossing of the AC line voltage. For example, the correlation time window may begin at the zero crossing or may be centered upon the zero crossing, or synchronized to the zero crossing in some other manner. In any case, the correlation time window may be short compared to the period of the AC line voltage such that correlations are performed while the AC voltage is less than a predetermined threshold voltage. The predetermined threshold voltage may be, for example, an estimate of a voltage level where arcing occurs in the circuit under test. The code generator 114 may run continuously or may also be synchronized with the zero crossing of the AC line voltage.

Figure 2:
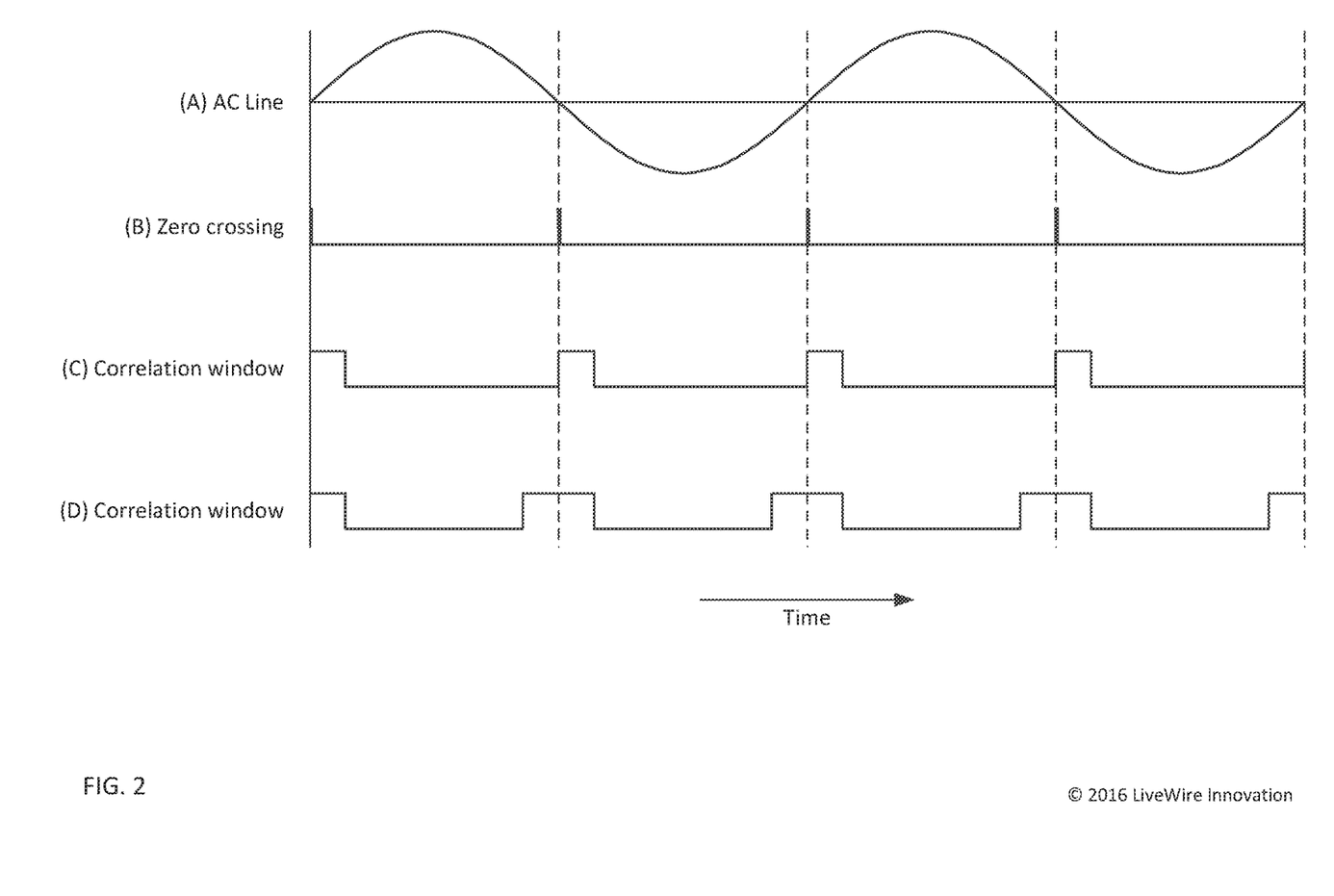
FIG. 2 is a timing diagram.

FIG. 2 is a timing diagram illustrating (A) the AC line voltage, (B) the zero crossing signal 132, (C) a correlation time window starting at each zero crossing, and (D) an alternative correlation time window centered upon each zero crossing. In this example, the correlation time windows (C) and (D) occur while the AC line voltage (A) is less than 40% of its maximum value. The duration of the correlation time windows may be greater than or less than the windows shown in this example, such that the maximum AC line voltage during each correlation time window is more than or less than 40% of its maximum value. The window is shorter than one-half cycle of the AC line voltage, and may be less than one quarter cycle.

Referring again to FIG. 1, the circuit under test may include dynamic loads that switched on and off during normal operation. Examples of dynamic loads include elevator and air conditioning motors, banks of lights, high power industrial equipment such as ovens and arc welders, and other equipment. Switching a dynamic load on or off will cause a corresponding change in the impedance of the circuit under test. The correlation data 120 produced immediately after switching a dynamic load may differ from the baseline 162 sufficiently to be identified as a potential fault.

To avoid repeated detection of dynamic loads, an ignore distance table 166 may be stored in the memory 160. The ignore distance table 166 may store one or more ignore distance values defining the location of known dynamic loads. The one or more ignore distance values may be stored as the distance from the live circuit tester to the corresponding dynamic load. The one or more ignore distance values may be stored as the round-trip transit time from the live circuit tester to the corresponding dynamic load. The one or more ignore distance values may be stored in some other form sufficient to identify the location of the corresponding dynamic load.

Upon detection of a potential fault in the circuit under test, the processor 150 compares an estimated location of the potential fault with the locations identified in the ignore distance table 166. A potential fault that matches a location identified in the ignore distance table 164 will be ignored, which is to say a potential fault that matches the location of a known dynamic load is not stored in the fault list 162 and is not reported to a user of the live circuit tester. In this context, the term "matches" means "equals with a predetermined tolerance." A potential fault that does not match a location identified in the ignore distance table 164 is stored in the fault list 162 and is reported to the user. A potential fault that matches a location identified in the ignore distance table 166 may not be ignored if switching the dynamic load trips the circuit breaker 102, disconnecting the live circuit tester and the circuit under test from the AC power source.

The user interface 170 includes a display element 172 and a data input element 174. The display element 172 may include one or more display devices such as a liquid crystal display or other flat panel display device. The display device may be configured to display the distance to, and type of, a detected fault. The display element 172 may also be configured to display additional information such as a batter charge level, a test in progress indicator, and/or the duration of an ongoing or completed test. The display element 172 may optionally include one or more indicator lights, for example to indicate when the live circuit tester is connected to an AC line, when a test is in progress, and/or when a fault has been detected.

The data input element 174 may include one or more data entry buttons or keys, a touch screen integrated with the display device, or a combination of a touch screen and one or more mechanical buttons or keys. For example, the data input element 174 may include a "test" button to start and stop tests, a "display" button to cause the live circuit tester to display the location and type of a detected fault (or the next detected fault when more than one fault has been detected), and an "ignore" button to instruct the live circuit tester to ignore the presently displayed fault. When the data input element 174 is or includes a touch screen, these buttons may be virtual buttons presented on the display element 172.

The live circuit tester 100 may commonly operate unattended for periods of time ranging from minutes to days. Each fault detected during an unattended test may be stored in the fault list 164 and subsequently displayed in response to an operator request via the user interface 170.

The power supply 180 provides operational power for the other elements of the live circuit tester 100. The power supply may receive input power from the AC line 105 and convert the AC line voltage into one or more DC voltages to power the other elements of the live circuit tester. AC line voltage may be tapped while conducting a test, or during non-test times and stored for test times. The power supply 182 may include or be coupled to a battery 182. The battery may provide a constant power source, or may provide operating power to the other elements of the live circuit tester 100 in the event the circuit breaker 102 is tripped during a test. The battery enables the live circuit tester 100 to store and display faults after the circuit breaker 102 is tripped or when the live circuit tester 100 is otherwise disconnected from the AC power source.

Description of Processes

Figure 3:
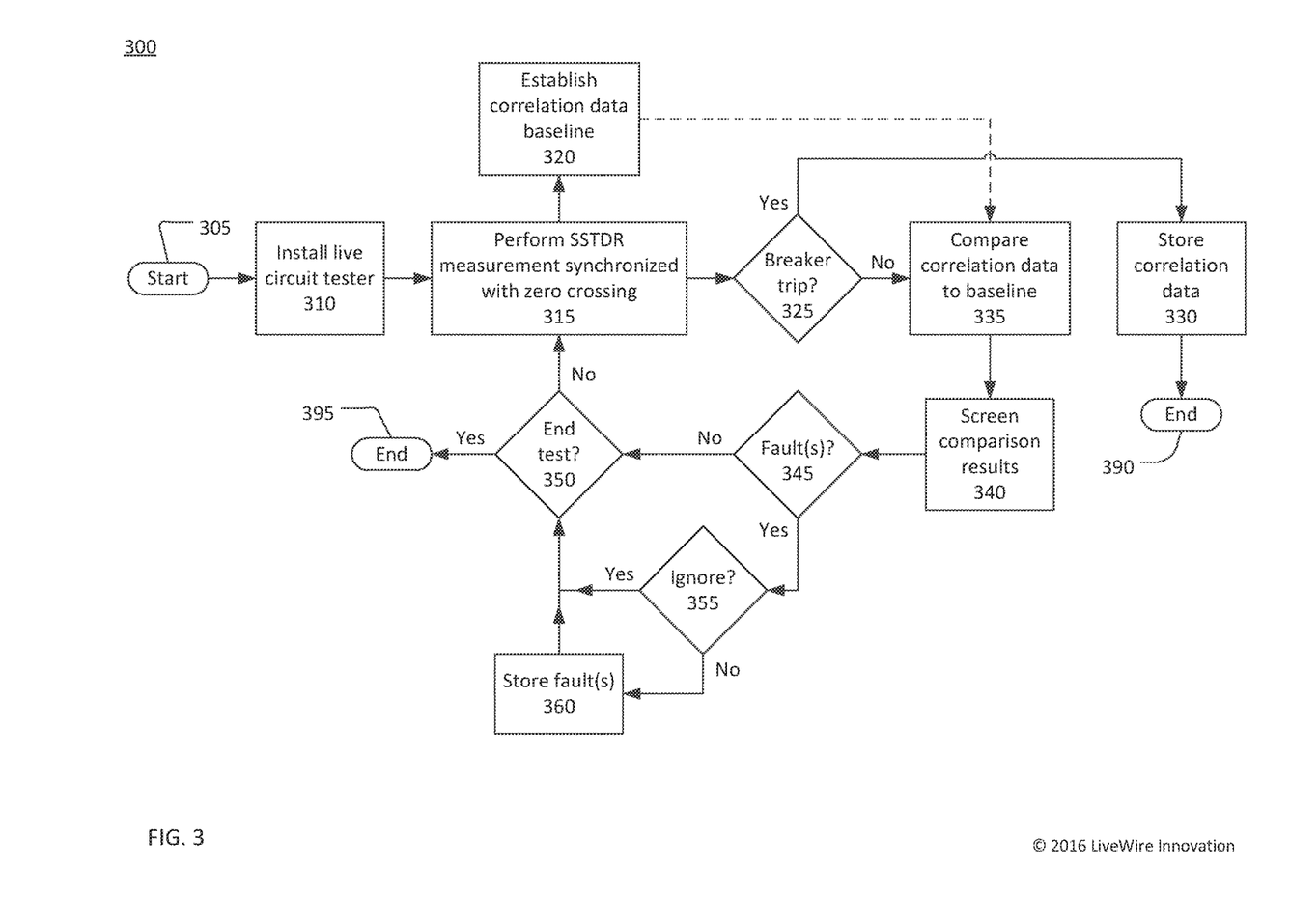
FIG. 3 is a flow chart of a process for monitoring a live circuit.

Referring now to FIG. 3, a process 300 for testing a live circuit using a live circuit tester, such as the live circuit tester 100, starts at 305. The process 300 normally ends at 395 after completion of a test, or may end prematurely at 390 if the testing results in a circuit breaker trip. The process 300 is cyclical in nature with the activities from 315 to 355 repeated every half-cycle of the AC line voltage.

At 310, the live circuit tester is installed, which is to say the live circuit tester is interposed between an AC power source and the circuit to be tested. For a typical test, the live circuit tester may be temporarily disposed with a circuit breaker box and connected between the circuit to be tested and the load side of the corresponding circuit breaker. Installation typically involves disconnecting one or two wires from the circuit breaker, reconnecting the disconnected wires to the load side of the live circuit tested, and installing one or two jumper wires between the live circuit tester and the circuit breaker.

At 315, an SSTDR measurement of the circuit under test is performed. Performing an SSTDR measurement includes generating a pn code, transmitting the pn code over the circuit under test, receiving reflections of the pn code energy from the circuit under test, and correlating the reflected pn code energy with delayed copies of the pn code. The result of an SSTDR measurement is a set of correlation data values representing the correlation of the reflected energy and the pn code delayed by respective delay times. Each delay time represents a round-trip transit time from the live circuit tester to a location within the circuit under test. Each delay time can be converted into a distance from the live circuit tested to the corresponding location within the circuit under test using a known or presumed propagation velocity of the pn code over the circuit under test. Thus each correlation data value represents an estimate of the degree of impedance discontinuity (or lack thereof) at a point within the circuit under test located at a respective distance from the live circuit tester. Each set of correlation data values may be considered as a vector C(t), where each element in the vector C(t) is the correlation of correlation of the reflected energy and the pn code delayed by a respective delay time.

Each SSTDR measurement performed at 315 may be synchronized with a zero crossing of the AC line voltage. Specifically, correlating the reflected pn code energy with delayed copies of the pn code may be performed in a correlation window synchronized with a zero crossing of the AC line voltage. For example, each correlation window may start at a zero crossing, as shown in FIG. 2(C), or may be centered upon a zero crossing, as shown in FIG. 2(D). Each correlation window may be synchronized with the zero crossing of the AC line voltage in some other manner. SSTDR measurements at 315 may be repeated at every zero crossing of the AC line, or at a rate of 100 or 120 measurements per second depending on the frequency of the AC line voltage. SSTDR measurements at 315 may be repeated at a slower rate, such as every second or every third every zero crossing of the AC line.

A baseline for the correlation data is established at 320. The correlation data baseline at time t may be considered as a vector B(t), where t is measured in SSTDR measurement intervals, which may be half cycles of the AC line voltage. Each element in the vector B(t) is the baseline value, or expected value, of the correlation of the reflected energy and the pn code delayed by a respective delay time. At 320, the correlation data baseline B(0) may be determined by summing or integrating correlation data from a plurality of consecutive SSTDR measurements. The correlation data baseline B(0) may be established, for example, by calculating a moving average of n sets of correlation data values, as follows:

$$B(0) = \frac{1}{n}\sum_{i=1}^{n} C(-i) \quad (1)$$

where B(0) is the correlation data baseline at the current time (t=0), C(−1) is the correlation data vector from the previous SSTDR measurement, C(−i) is the correlation data from the $i^{th}$ previous SSTDR measurement, and n is an integer greater than one. Alternatively, the correlation data baseline may be determined at 320 as a decaying integral of the correlation data, as follows:

$$B(0)=xC(0)+(1-x)B(-1) \quad (2)$$

where B(0) is the correlation data baseline at the current time (t=0), C(0) is the correlation data vector from the current SSTDR measurement, B(−1) is the correlation data baseline at time of the previous SSTDR measurement, and x is decay constant between zero and one. The correlation data baseline may be determined at 320 in some other manner.

At 325 a determination may be made whether or not the circuit breaker tripped during or since the previous SSTDR measurement. A circuit breaker is indicated by a loss of power on the AC line (105 in FIG. 1) accompanied by automatically switching to battery power for the operation of the live circuit tester. When the circuit breaker has tripped ("yes" at 315), the correlation data may be stored at 330 for diagnostic purposes and the test may end at 390.

When the circuit breaker has not tripped ("no" at 325), the process 300 continues at 335. At 335, the correlation data vector from the most recent SSTDR measurement at 315 is compared to the correlation data baseline from 320. The comparison may be performed, for example, by subtracting each element of the correlation data vector from the corresponding element of the correlation data baseline. Potential faults may be indicted by differences between corresponding elements of the correlation data vector and the correlation data baseline.

The comparison results from 335 are screened at 340 to identify faults. In this context, "screened" has its conventional definition of "examined methodically in order to make a separation into different groups." In this case, the correlation data is examined to distinguish differences between the correlation data vector and the correlation data baseline due to noise and routine variations in the circuit under test (i.e. non-faults), and differences due to faults in the circuit under test. One or more screening criteria may be used to distinguish faults from non-faults. For example a difference between corresponding elements of the correlation data vector and the correlation data baseline may be considered a fault only if the magnitude of the difference exceeds a first predetermined threshold. A difference between corresponding elements of the correlation data vector and the correlation data baseline may be considered a fault only if the difference persists for multiple consecutive SSTDR measurements, such as three consecutive measurement or five consecutive measurements. A difference between corresponding elements of the correlation data vector and the correlation data baseline may be considered a fault only if the difference persists for n consecutive SSTDR measurements, where n is a predetermined integer number greater than one. A difference between corresponding elements of the correlation data vector and the correlation data baseline may be considered a fault only if the total of the differences summed over a predetermined number of consecutive SSTDR measurements exceeds a second predetermined threshold. Other screening criteria may be used to distinguish faults and non-faults in addition to, or instead of, these example criteria.

At 345, a determination is made whether or not the screening at 340 identified one or more potential faults. If a determination is made that no potential faults have been detected ("no" at 345), the process 300 proceeds to 350, where a determination is made whether or not an instruction to end the test has been received. An instruction to end the test may be received, for example, from an operator using a physical or virtual "test" button on the live circuit tester. When an instruction to end the test has been received ("yes" at 350), the testing process ends at 395. Any fault data stored during the test is retained and may be displayed after the conclusion of the test. When an instruction to end the test has not been received ("no" at 350), the process 300 returns to 315 to perform another SSTDR measurement. The actions from 315 to 350 repeat cyclically until the test is ended by a circuit breaker trip or operator action.

When a determination is made at 345 that a potential fault has been detected ("yes" at 345), a determination may be made at 355 whether or not the detected potential fault should be ignored. As previously discussed, the circuit under test may include dynamic loads that switch on and off during normal operation. Switching a dynamic load on or off will cause a change in the impedance of the circuit under test at the location of the dynamic load and a corresponding change in the correlation data produced by the SSTDR measurements. When a dynamic load is switched and maintained in its new state (i.e. either on or off) for a prolonged period, a new correlation data baseline is automatically established at 320. Depending on the method used to establish the correlation at baseline, the transition from the old correlation data baseline to the new correlation data baseline may occur over an extended time period. SSTDR measurements performed immediately after switching a dynamic load and during the correlation baseline transition period may result in the dynamic load being identified as a potential fault at 345.

To avoid repeated reporting of dynamic loads, one or more ignore distance values defining the location of known dynamic loads or other potential faults may be stored in an ignore distance table in the memory of the live circuit tester. The one or more ignore distance values may be stored as the distance from the live circuit tester to the corresponding dynamic load or the round-trip transit time from the live circuit tester to the corresponding dynamic load. The one or more ignore distance values may be stored in some other form sufficient to identify the location of the corresponding dynamic load.

When a determination is made at 345 that a potential fault has been detected, a location of the potential fault (which may be expressed as a distance and/or round trip transit time to the potential fault) is derived from the correlation data. At 355, the location of the potential fault is compared to ignore distance values stored in the ignore distance table. A potential fault that matches an ignore distance values stored in the ignore distance table is ignored ("yes" at 355), which is to say the location and type of the potential fault are not stored in memory and are not subsequently reported to the test operator. A potential fault that does not match any ignore distance value stored in the ignore distance table ("no" at 355) is stored in memory for later reporting to the operator. In either case, the process 300 continues from 350 as previously described.

Figure 4:
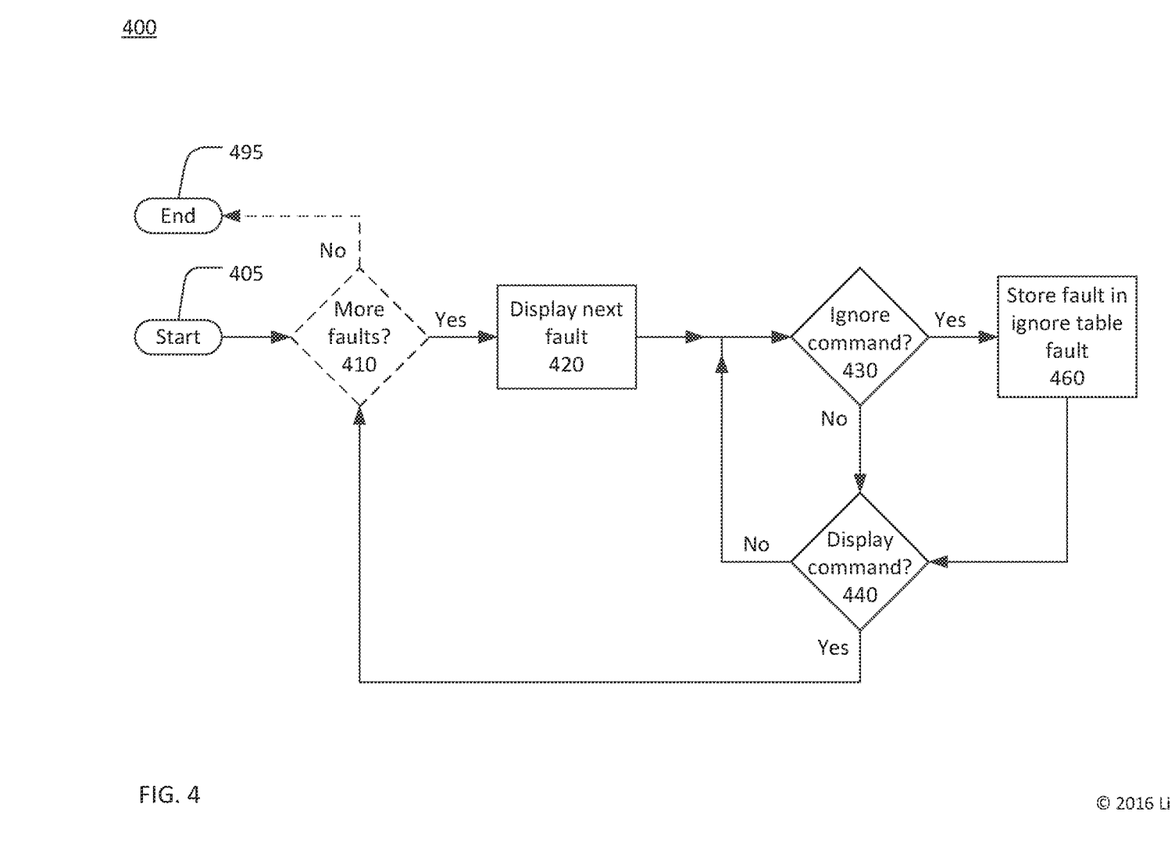
FIG. 4 is a flow chart of a process for reporting faults detected by a live circuit tested.

FIG. 4 is a flow chart of a process 400 for reporting faults detected by a live circuit tester such as the live circuit tester 100. The process 400 begins at 405 and may optionally end at 495. The process 400 is cyclic in nature and the actions from 410 to 440 may be repeated for each fault detected by the live circuit tester during a test session. Each cycle through the process 400 results in one detected fault to be reported. When more than one fault has been detected, the faults may be sequentially reported in the order detected, in the order of increasing distance from the live circuit tester, or in some other order.

The process 400 may be performed during a test session, or after a test session is terminated by an operator action or a circuit breaker trip. The process 400 may be initiated at 405 by an operator action, such as pressing a physical or virtual key on the live circuit tester. The key used to initiate the process 400 may be, for example, a display command key used to request display of a fault.

After the process 400 is initiated at 405, an optional determination whether or not there are more faults to be reported may be made at 410. On the first cycle though the process 400, immediately after the process 400 is initiated, the determination at 410 will be whether or not there are any faults at all to be reported. On subsequent cycles through the process 400, the determination at 410 will be whether or not there are any additional faults that have not yet been reported. When there are no more faults to report ("no" at 410) the process 400 may end at 495.

When a determination is made at 450 that there are more faults to be reported ("yes" at 450), a next fault is displayed on a display device of the live circuit tester at 420. The information displayed at 420 may include, for example, a distance to the fault and whether the fault is a short or an open. Additional information, such as whether a fault is intermittent, persistent, or arcing may also be displayed.

After the next fault is displayed at 420, the process 400 may wait for receipt of either an ignore command or a display command. Either of these commands may be received from an operator via respective physical or virtual keys on the live circuit tested. In FIG. 4, waiting for one of these commands is represented as an idle loop between the actions at 430 and 440. Alternative implementations are possible. For example, the process 400 may be paused and subsequently resumed by an interrupt indicating either a display command or an ignore command has been received.

Receipt of an ignore command indicates the operator does not want future detections of the display fault to be reported. This may typically happen when the displayed "fault" is false detection resulting from switching a dynamic load within the circuit under test. When an ignore command is received ("yes" at 430) the location of the currently displayed fault is saved at 460. For example, the location of the currently displayed fault may be saved as an ignore distance value in an ignore distance table in memory within the live circuit tester. After saving the fault to be ignored, the process 400 may return to the idle loop 430/440 to wait for receipt of a display command. When a display command is received ("yes" at 440), the process 400 repeats from 410. Since the ignore command stores the location of the currently displayed fault, an ignore command, when desired, must be entered before the next display command.

When the optional action at 410 is not implemented in the process 400, initiation of the process at 450 causes a first fault to be display at 420. Receipt of a display command at 440 causes the next fault to be displayed at 420. When only one fault has been detected, that one fault may be displayed continuously. When multiple faults have been detected, the display will repeatedly cycle through the faults in sequence in response to display commands. When the optional action at 410 is not implemented in the process 400, the process 400 may continue perpetually, or until stopped by an event such as expiration of a timeout period or an operator action, neither of which is shown in FIG. 4.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. Apparatus for testing a live circuit powered from an alternating current (AC) voltage, comprising:
    a spread spectrum time domain reflectometer (SSDTR) configured to perform SSTDR measurements of the live circuit;
    a memory storing one or more ignore distance values,
    a processor coupled to the SSTDR and the memory, the processor configured to:
        detect a potential fault in the live circuit based on results of one or more SSTDR measurements, the potential fault associated with a distance from the apparatus,
        compare the distance associated with the potential fault with each of the one or more ignore distance values, and
        store, in the memory, data defining the potential fault if the associated distance does not match any of the one or more ignore distance values.

2. The apparatus of claim 1, wherein the processor is further configured to:
    ignore the potential fault when the associated distance matches any of the one or more ignore distance values.

3. The apparatus of claim 1, wherein the data defining the potential fault includes the associated distance and a fault type.

4. The apparatus of claim 1, further comprising:
a user interface including a display and an input element coupled to the processor,
wherein the processor is further configured to display the data defining the potential fault in response to a first user command received via the input element.

5. The apparatus of claim 4, wherein the processor is further configured to store the distance associated with the potential fault in the memory as an ignore distance value in response to a second user command received via the input element.

6. Apparatus for testing a live circuit powered from an alternating current (AC) voltage, comprising:
a spread spectrum time domain reflectometer (SSDTR) configured to perform SSTDR measurements of the live circuit;
a memory for storing an ignore distance table containing one or more ignore distance values and a fault table containing data defining faults;
a processor coupled to the SSTDR and the memory, the processor configured to:
detect one or more potential faults in the live circuit based on results of one or more SSTDR measurements, each of the one or more potential faults associated with a respective distance from the apparatus,
compare the respective distance associated with each of the one or more potential faults with each of the one or more ignore distance values, and
store, in the fault table, data defining each potential fault having an associated distance that does not match any of the one or more ignore distance values.

7. The apparatus of claim 6, wherein the processor is further configured to:
ignore each of the one or more potential faults having associated distances that does match any of the one or more ignore distance values.

8. The apparatus of claim 6, wherein the data defining each potential fault includes the associated distance and a fault type.

9. The apparatus of claim 6, further comprising:
a user interface including a display and an input element coupled to the processor,
wherein the processor is further configured to display data defining a selected potential fault from the fault table in response to a first user command received via the input element.

10. The apparatus of claim 9, wherein the processor is further configured to store the distance associated with the selected potential fault in the ignore distance table in response to a second user command received via the input element.

11. A method for testing a live circuit powered from an alternating current (AC) voltage, comprising:
storing, in a memory, one or more ignore distance values,
performing spread spectrum time domain reflectometer (SSDTR) measurements of the live circuit;
detecting a potential fault in the live circuit based on results of one or more of the SSTDR measurements, the potential fault associated with a distance from the apparatus,
comparing the distance associated with the potential fault with each of the one or more ignore distance values, and
storing, in the memory, data defining the potential fault if the associated distance does not match any of the one or more ignore distance values.

12. The method of claim 11, further comprising:
ignoring the potential fault when the associated distance matches any of the one or more ignore distance values.

13. The method of claim 11, wherein the data defining the potential fault includes the associated distance and a fault type.

14. The method of claim 11, further comprising:
displaying the data defining the potential fault in response to a first user command.

15. The method of claim 14, further comprising:
storing, in the memory, the distance associated with the potential fault as an ignore distance value in response to a second user command.

\* \* \* \* \*